(12) United States Patent
Kim et al.

(10) Patent No.: US 6,631,838 B2
(45) Date of Patent: Oct. 14, 2003

(54) METHOD FOR FABRICATING PRINTED CIRCUIT BOARD

(75) Inventors: Nam-Jin Kim, Osan (KR); Young-Cheol Ahn, Osan (KR); Won-Jae Kim, Osan (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/832,122

(22) Filed: Apr. 11, 2001

(65) Prior Publication Data

US 2002/0084314 A1 Jul. 4, 2002

(30) Foreign Application Priority Data

Apr. 11, 2000 (KR) ......................... 2000/19045

(51) Int. Cl.[7] .................. B23K 35/24; B21D 39/00; H05K 1/00; H05K 1/11
(52) U.S. Cl. .................. 228/225; 228/165; 174/250; 174/251; 174/261
(58) Field of Search ................ 228/225, 165, 228/185, 33, 39; 174/250, 251, 261, 266; 29/829

(56) References Cited

U.S. PATENT DOCUMENTS

| | | | | |
|---|---|---|---|---|
| 4,293,377 A | * | 10/1981 | Miyajima | 174/251 |
| 4,360,570 A | * | 11/1982 | Andreades et al. | 427/97 |
| 5,252,195 A | * | 10/1993 | Kobayashi et al. | 205/126 |
| 5,284,548 A | * | 2/1994 | Carey et al. | 216/105 |
| 5,308,929 A | * | 5/1994 | Tani et al. | 174/262 |
| 5,309,632 A | * | 5/1994 | Takahashi et al. | 174/266 |
| 5,690,837 A | * | 11/1997 | Nakaso et al. | 216/17 |
| 5,863,447 A | * | 1/1999 | Coteus et al. | 216/17 |
| 6,097,089 A | * | 8/2000 | Gaku et al. | 257/675 |
| 6,228,511 B1 | * | 5/2001 | Sachdev et al. | 174/261 |
| 6,242,078 B1 | * | 6/2001 | Pommer et al. | 174/250 |
| 6,282,782 B1 | * | 9/2001 | Biunno et al. | 29/852 |
| 6,323,436 B1 | * | 11/2001 | Hedrick et al. | 174/256 |
| 6,376,158 B1 | * | 4/2002 | Jones et al. | 174/261 |

* cited by examiner

Primary Examiner—Tom Dunn
Assistant Examiner—L. Edmondson
(74) Attorney, Agent, or Firm—Birch, Stewart, Kolasch & Birch, LLP

(57) ABSTRACT

A method for fabricating a printed circuit board includes the steps of: fabricating a printed circuit board having at least one collapsed portion; depositing a first solder resist in the collapsed portion; exposing the first solder resist-coated printed circuit board at a pressure lower than atmospheric pressure for a predetermined time; coating a second solder resist on the entire surface of the printed circuit board; and drying and hardening the first and the second solder resists. With this method, when a solder resist is coated, since an air space does not remain in a blind via hole, the reliability of the attachment between a printed circuit board and the solder resist layer is increased.

9 Claims, 4 Drawing Sheets

METHOD FOR FABRICATING PRINTED CIRCUIT BOARD

BACKGROUND OF THE INVENTION

1. Field of the Invention

The present invention relates to a printed circuit board, and more particularly to a method for fabricating a printed circuit board in which when a solder resist is coated, an air space is not allowed to remain in a blind via hole, thereby heightening the reliability of the attachment between the printed circuit board and a solder resist layer.

2. Description of the Background Art

FIG. 1 is a sectional view of a printed circuit board in accordance with a conventional art.

As shown in the drawing, a first conductive circuit pattern 3a is formed at the upper surface of a substrate 1, and a first insulation resin layer 5a is formed at the upper surface of the first conductive circuit pattern 3a. Via holes 7 are formed at the first insulation resin layer 5a, through which the upper surface of the first conductive circuit pattern 3a is exposed.

A second conductive circuit pattern 3b is formed at the upper surface of the first insulation resin layer 5a, and a first plated layer 9a is formed at the upper surface of the second conductive circuit pattern 3b, at the inner wall face of the via hole 7 and at the upper surface of the first conductive circuit pattern 3a exposed through the via hole 7. The second conductive circuit pattern 3b formed at the upper surface of the first insulation resin layer 5a and the first conductive circuit pattern 3a formed at the lower surface of the first insulation resin layer 5a are electrically connected.

A second insulation resin layer 5b is formed at the upper surface of the second plate layer 9a and at the upper surface of the first insulation resin layer 5a.

Via holes 7 are formed at the upper surface of the second insulation resin layer 5b with the upper surface of the first plated layer 9a partially exposed.

A third conductive circuit pattern 3c is formed at the upper surface of the second insulation resin layer 5b.

A second plated layer 9b is formed at the upper surface of the third conductive circuit pattern 3c, the inner wall of the via hole 7 and the first plate layer 9a.

The second conductive circuit pattern 3b and the third conductive circuit pattern 3c are electrically connected by the second plated layer 9b.

A solder resist 11 is coated at the upper surface of the second plated layer 9b and of the second insulation resin layer 5b. The exposed portion 12 of the second plated layer 9b which has not been coated with the solder resist 11 is connected with an outer lead of an electronic part.

The printed circuit board in the above described structure has the following problems.

In fabricating the printed circuit board, the following problems arise when the solder resist layer is finally coated at the upper surface of the plated layer. For example, the surface of the plated layer of the printed circuit board is rough, not level. In other words, the surface of the plated layer at the portion where the via holes are formed is concave compared with the other portion where a via hole is not formed. In the case where the solder resist layer is coated at the upper surface of the plated layer having a level portion and a collapsed portion, the solder resist does not entirely fill the collapsed portion, forming a void. The reason for this is that, when the solder resist is applied, the air in the via hole is not completely removed, whereby the air remaining in the via hole forms an air space. The air space prevents the solder resist from completely filling the via hole.

FIG. 2 illustrates a via hole 7, a solder resist 11 and a void 20 formed in the via hole 7. The same elements as in FIG. 1 are given the same reference numerals. In addition, a plated layer 9b is formed at the surface of the inner wall at the bottom surface of the via hole 7 and at the upper surface of the conductive circuit pattern 3c. The air fills the void 20 within the via hole 7, and the solder resist 11 covers the upper surface of the void 20.

The void formed in the via hole 7 as shown in FIG. 2 causes the following problems. When the printed circuit board is exposed to a high temperature process such as in the case where parts are mounted on the printed circuit board, the air present in the void 20, results in a rupturing of the solder resist 11 which covers the void 20. Then, the solder resist 11 falls out and the plated layer 9b and the conductive circuit pattern 3c also break down, degrading the reliability of the printed circuit board.

SUMMARY OF THE INVENTION

Therefore, an object of the present invention is to provide a method for fabricating a reliable printed circuit board.

Another object of the present invention is to provide a method for fabricating a printed circuit board in which an air space does not result in a portion of a printed circuit board collapsing, thereby improving the adhesion reliability between the printed circuit board and a solder resist.

To achieve these and other advantages and in accordance with the purpose of the present invention, as embodied and broadly described herein, there is provided a method for fabricating a printed circuit board including the steps of: fabricating a printed circuit board having at least one collapsed portion; depositing a first solder resist in the collapsed portion; exposing the first solder resist-coated printed circuit board at a pressure lower than atmospheric pressure for a predetermined time; coating a second solder resist on the entire surface of the printed circuit board; and drying and hardening the first and the second solder resists.

To achieve the above objects, the method for fabricating a printed circuit board further comprises a step of mounting a window screen having a window larger than the collapsed portion at a position corresponding to the collapsed portion on the upper surface of the printed circuit board, before the step of coating the first solder resist.

To achieve the above objects, in the step of exposing the printed circuit board to a pressure lower than atmospheric pressure in the method for fabricating a printed circuit board, the pressure is about $\frac{1}{10}$ of atmospheric pressure.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
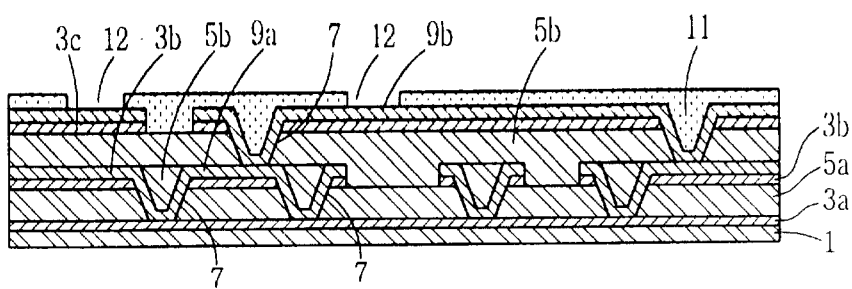
FIG. 1 is a sectional view of a printed circuit board in accordance with a conventional art.
Figure 2:
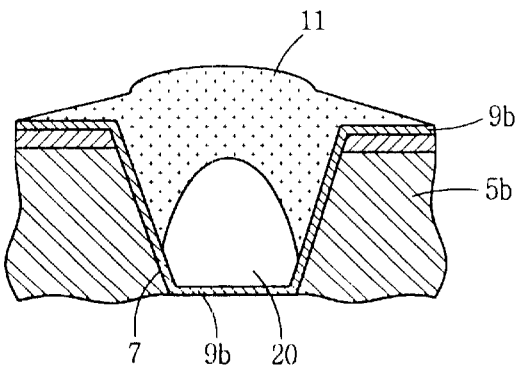
FIG. 2 is an enlarged view of a collapsed portion coated with the solder resist of FIG. 1 in accordance with the conventional art.

FIG. 2 is an enlarged view of a collapsed portion coated with the solder resist of FIG. 1.

The present invention is directed to a method for filling a resin layer in a collapsed portion without a void. With reference to FIG. 2, the 'collapsed portion' is defined as follows. The collapsed portion is a portion of the surface of the printed circuit board which is dented due to a via hole formed to electrically connect the upper and lower layer conductive patterns or a through hole formed to penetrate the printed circuit board.

FIGS. 3A through 3F are vertical sectional views of the printed circuit board illustrating sequential fabricating processes of the printed circuit board, and FIGS. 4A through 4D are enlarged views of the collapsed portion in the vicinity of the circled portions A, B, C and D of the FIGS. 3C through 3F in accordance with the present invention.

Figure 3A:
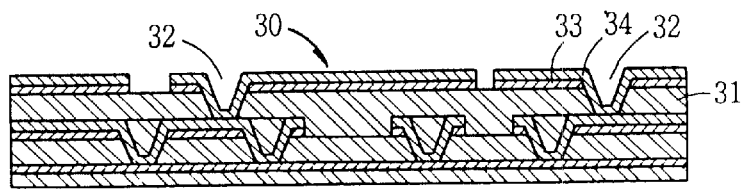
FIGS. 3A through 3F are vertical sectional views of the printed circuit board illustrating sequential fabricating processes of the printed circuit board in accordance with the present invention.

With reference to FIG. 3A, a printed circuit board (30) is fabricated without a coated solder resist layer. The printed circuit board of FIG. 3A is fabricated by adopting the conventionally known method, detailed descriptions of which are thus omitted.

The printed circuit board includes a resin layer 31, a plurality of via holes 32 formed penetrating the upper and the lower surface of the resin layer, a conductive circuit pattern 33 formed at the upper surface of the resin layer 31, and a plated layer 34 plated at the upper surface of the conductive circuit pattern 33 and at the inner wall face and bottom surface of the via hole 32. Accordingly, in the case of this printed circuit board, since the via hole 32 is collapsed, it becomes the collapsed portion.

Figure 3B:
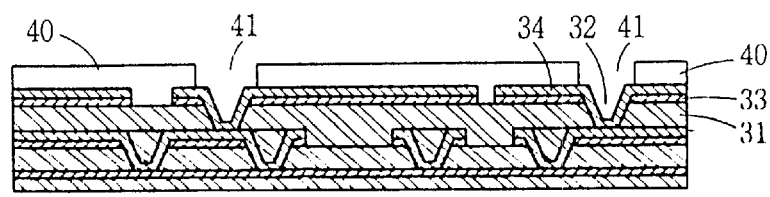

Next, as shown in FIG. 3B, a window screen 40 having a plurality of windows 41 formed penetrating its upper and lower faces is mounted at the upper surface of the printed circuit board 30. The window 41 of the window screen 40 is formed to correspond to the collapsed portion 32 of the printed circuit board 30, and is larger than the entrance of the collapsed portion 32.

Referring to the formation of the window 41 of the window screen 40, oil is coated on a textile with uniform holes formed, and in this state, oil on a portion having a larger diameter than the upper portion of the collapsed portion 32 is removed through a typical exposure and development method, thereby forming the window 41 at the position corresponding to the collapsed portion 32.

Figure 3C:
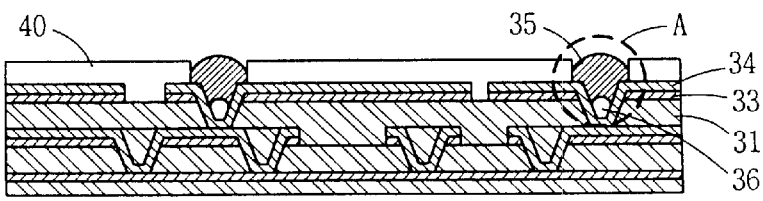
Figure 4A:
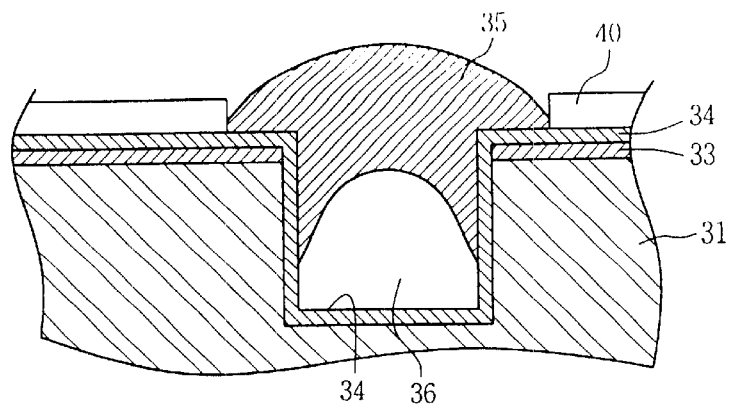
FIGS. 4A through 4D are enlarged view of the collapsed portion and its vicinity of the circled portions A, B, C and D of the FIGS. 3C through 3F in accordance with the present invention.

Next, as shown in FIGS. 3C and 4A, the first solder resist 35 is applied to the window 41 and the collapsed portion 32 of the printed circuit board. At this time, since the collapsed portion 32 is filled with air, the solder resist 35 does not totally fill the collapsed portion 32, forming a void 36 in the collapsed portion 32 covered with the first solder resist 35. FIG. 4A shows the enlarged view of the portion indicated by a circle 'A', representing the portion around the collapsed portion 32, of FIG. 3C.

The printed circuit board 30 of FIG. 3C is then put in a vacuum chamber and exposed to a vacuum atmosphere. At this time, the pressure in the vacuum chamber is set to be about $\frac{1}{10}$ of atmospheric pressure $P_o$, and the time for exposing the printed circuit board is set to be approximately 1–2 minutes.

Figure 3D:
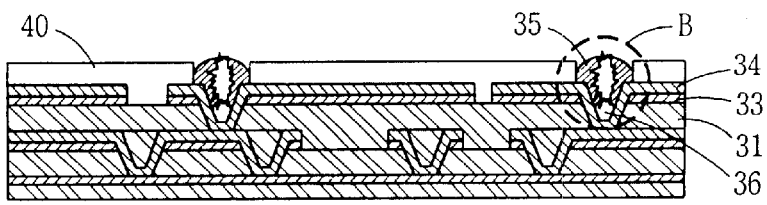
Figure 4B:
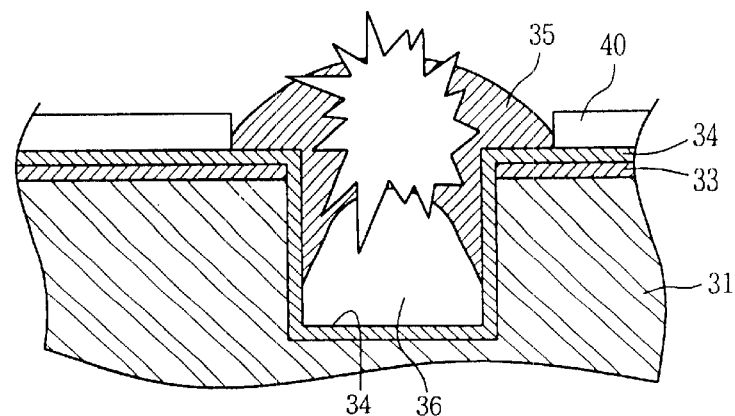

When the printed circuit board 30 is exposed to the vacuum atmosphere, since the internal pressure within the void 36 is in a state of atmospheric pressure while the outer side is in a state of being pressured below atmospheric pressure, the air within the void 36 breaks the first solder resist 35 causing it to flow out into the vacuum environment, as shown in FIGS. 3D and 4B. FIG. 4B is an enlarged view of the portion indicated as a circle 'B' of FIG. 3D.

Figure 3E:
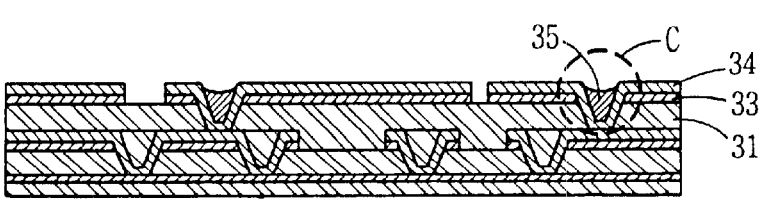
Figure 4C:
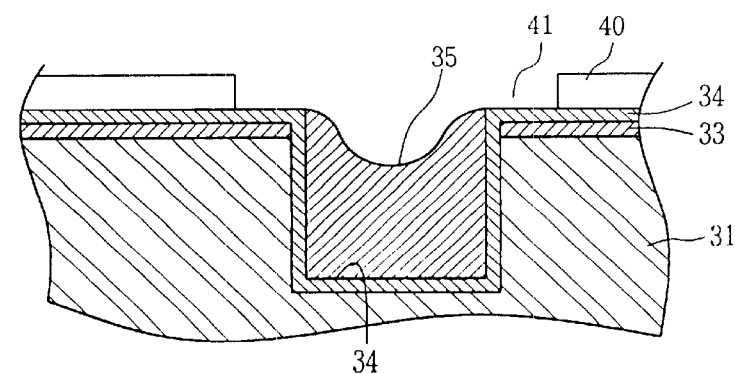

Consequently, as shown in FIGS. 3E and 4C, the first solder resist 35, which is in a half-hardened state, flows into the void 36 where the air has vacated, completely filling the collapsed portion 32. FIG. 4C is an enlarged view of the portion indicated by a circle 'C' of FIG. 3E.

Figure 3F:
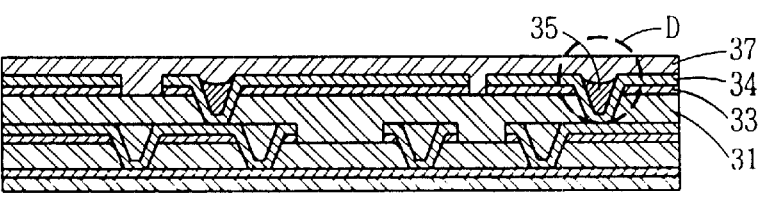
Figure 4D:
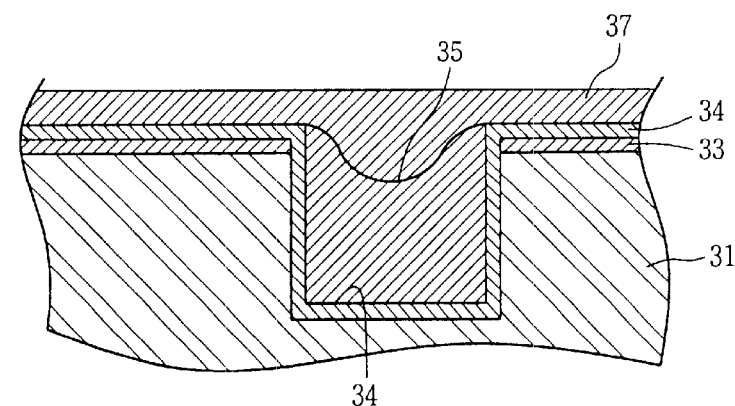

Then, as shown in FIGS. 3F and 4D, the window screen 40 is removed, and a second solder resist 37 is coated on the entire upper surface of the solder resist 35 of the plated layer 34 and the collapsed portion 32 at atmospheric pressure. FIG. 4D is an enlarged view of the portion indicated by a circle 'D' of FIG. 3F.

In this manner, the coating process of the solder resist is performed twice, whereby the air space is prevented from forming in the collapsed portion of the printed circuit board and thus a printed circuit board having an even surface can be obtained. As a result, the attachment reliability between the printed circuit board and the solder resist is heightened.

After the solder resist layer 37 is coated, the resulting structure is subject to drying and hardening, thereby completing the fabrication of the printed circuit board.

Referring to the method as shown in FIGS. 4A and 4D, the window 41 of the window screen 40, used for coating the solder resist 35, is formed larger than the entrance of the collapsed portion 32, and the collapsed portion 32 is entirely exposed through the window 41.

Figure 5A:
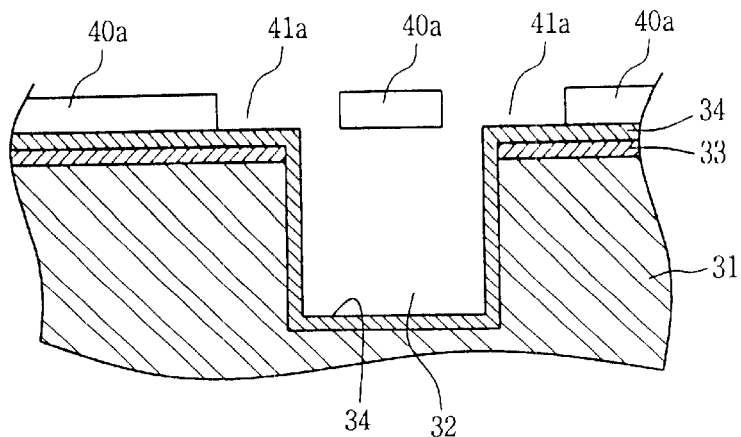
FIGS. 5A and 5C are alternatives of FIGS. 4A and 4C in accordance with the present invention.
Figure 5B:
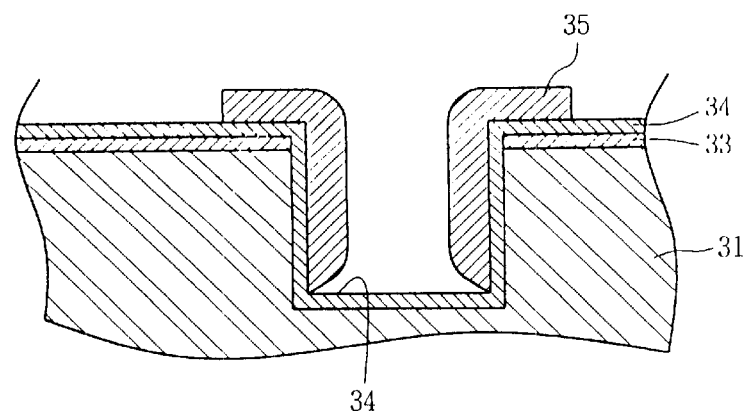
Figure 5C:
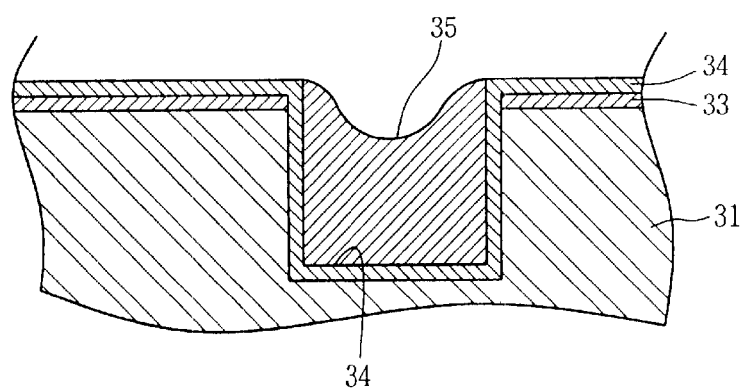

Alternatively, as shown in FIGS. 5A and 5C, a window screen where the window is formed only at the perimeter of the collapsed portion 32 and the central part of the collapsed portion 32 that shields the window screen, may be used.

Namely, with reference to FIG. 5A, the window screen is installed in a manner that the central part of the collapsed portion 32 is shielded by the window screen 40a and the outer periphery of the entrance of the collapsed portion 32 is exposed through the window 41a. In this case, when the solder resist 35 is coated, as shown in FIG. 5B, the solder resist 35 is coated only at the side wall of the collapsed portion 32 while the central part is not coated. In this state, where the printed circuit board is put in the vacuum chamber to expose it to the vacuum atmosphere, when the air flows out of the collapsed portion 32, the solder resist 35 is not broken. After the air flows out, as shown in FIG. 5C, the half-hardened solder resist 35 fills the inside of the collapsed portion 38.

As so far described, the method for fabricating a printed circuit board according to the present invention has the following advantage. That is, since the air space having a different heat characteristic to that of the material of the printed circuit board is prevented from occurring, the attachment reliability between the printed circuit board and the solder resist can be improved. Namely, the solder resist will not wear off or break down during the process of coating the solder resist or during the use of the printed circuit board coated with the solder resist, so that the quality of a product adopting the printed circuit board can be highly improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for fabricating a printed circuit board comprising the steps of:
    fabricating a printed circuit board having at least one collapsed portion;
    depositing a first solder resist in the collapsed portion;
    exposing the first solder resist-coated printed circuit board at a pressure lower than atmospheric pressure for a predetermined time and removing air from the collapsed portion;
    coating a second solder resist on the entire surface of the printed circuit board and filling the collapsed portion with the second solder resist; and
    drying and hardening the first and second solder resists.

2. The method of claim 1, further comprising a step of mounting a window screen having a plurality of windows on the printed circuit board, before the step of depositing the first solder resist.

3. The method of claim 2, wherein each of the windows is configured to expose an area larger that that of the entire collapsed portion.

4. The method of claim 2, wherein the window is formed to expose only the outer periphery of the collapsed portion.

5. The method of claim 1, wherein the pressure is about $\frac{1}{10}$ of the atmospheric pressure.

6. A method for fabricating a printed circuit board having a plurality of circuit pattern layers, an insulating layer for insulating the circuit pattern layers and a plated layer for connecting the circuit pattern layers insulated by the insulating layer, comprising the steps of:
    providing a window screen having a plurality of windows on the printed circuit board;
    forming the plated layer at a collapsed portion which is formed as a via hole, and coating a solder resist only at the outer periphery of the collapsed portion through the windows;
    exposing the printed circuit board coated with the solder resist at a pressure lower than atmospheric pressure in a vacuum chamber and removing air from the collapsed portion;
    coating an additional solder resist at the collapsed portion so as to fill the collapsed portion with the additional solder resist; and
    drying and hardening the solder resists.

7. The method of claim 6, wherein the window is formed to expose the entire collapsed portion and an area larger than the entrance to the collapsed portion.

8. The method of claim 6, wherein the window is formed to expose only the outer periphery of the collapsed portion.

9. The method of claim 6, wherein the pressure is about $\frac{1}{10}$ of atmospheric pressure.

* * * * *